(12) United States Patent
Lastras-Montano et al.

(10) Patent No.: US 7,984,329 B2
(45) Date of Patent: Jul. 19, 2011

(54) SYSTEM AND METHOD FOR PROVIDING DRAM DEVICE-LEVEL REPAIR VIA ADDRESS REMAPPINGS EXTERNAL TO THE DEVICE

(75) Inventors: Luis A. Lastras-Montano, Cortlandt Manor, NY (US); Darren L. Anand, Williston, VT (US); Jeffrey H. Dreibelbis, Williston, VT (US); Charles A. Kilmer, Essex Junction, VT (US); Warren E. Maule, Cedar Park, TX (US); Robert B. Tremaine, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 425 days.

(21) Appl. No.: 11/849,452

(22) Filed: Sep. 4, 2007

(65) Prior Publication Data

US 2009/0063896 A1    Mar. 5, 2009

(51) Int. Cl.
*G06F 11/00* (2006.01)

(52) U.S. Cl. .......................................... 714/8

(58) Field of Classification Search ............ 714/2–8, 714/13–16, 18, 20, 21, 30, 31, 37, 39, 42, 714/54, 25
See application file for complete search history.

(56) References Cited

U.S. PATENT DOCUMENTS

| | | | | |
|---|---|---|---|---|
| 5,200,959 A * | 4/1993 | Gross et al. | ................... | 714/723 |
| 5,457,791 A * | 10/1995 | Matsumoto et al. | ............... | 714/5 |
| 5,513,135 A | 4/1996 | Dell et al. | | |
| 5,701,270 A * | 12/1997 | Mohan Rao | ............. | 365/230.03 |
| 5,867,642 A * | 2/1999 | Vivio et al. | ........................ | 714/8 |
| 5,920,512 A * | 7/1999 | Larsen | ........................ | 365/200 |
| 6,055,611 A * | 4/2000 | Wright et al. | .................. | 711/162 |
| 6,081,463 A * | 6/2000 | Shaffer et al. | .................. | 365/200 |
| 6,178,126 B1 | 1/2001 | Kirihata et al. | | |
| 6,381,685 B2 | 4/2002 | Dell et al. | | |
| 6,732,229 B1 * | 5/2004 | Leung et al. | ................... | 711/109 |
| 7,154,781 B2 * | 12/2006 | Lakhani et al. | ........... | 365/185.09 |
| 7,219,271 B2 * | 5/2007 | Kleveland et al. | ............. | 714/718 |
| 2002/0154559 A1 * | 10/2002 | Shionoya | ........................ | 365/201 |
| 2003/0115518 A1 * | 6/2003 | Kleveland et al. | ............. | 714/718 |
| 2005/0114726 A1 * | 5/2005 | Ouchi | ............................. | 714/5 |
| 2005/0276130 A1 * | 12/2005 | Lakhani et al. | ................ | 365/200 |
| 2006/0262615 A1 * | 11/2006 | Gotoh | ........................... | 365/200 |
| 2007/0109856 A1 * | 5/2007 | Pellicone et al. | ........ | 365/185.09 |
| 2007/0255999 A1 * | 11/2007 | Risse | ............................ | 714/766 |

* cited by examiner

*Primary Examiner* — Nadeem Iqbal
(74) *Attorney, Agent, or Firm* — Cantor Colburn LLP; William A. Kinnaman, Jr.

(57) ABSTRACT

A system and method for providing DRAM device-level repair via address remappings external to the device. A system includes a memory controller having an interface to one or more memory devices via a memory module. The memory devices include addressable redundant and non-redundant memory blocks. The memory controller also includes a mechanism for utilizing one or more redundant memory blocks in place of one or more failing non-redundant memory blocks via an address remapping external to the memory device. The remapping occurs while the system is on-line.

22 Claims, 7 Drawing Sheets

SYSTEM AND METHOD FOR PROVIDING DRAM DEVICE-LEVEL REPAIR VIA ADDRESS REMAPPINGS EXTERNAL TO THE DEVICE

BACKGROUND OF THE INVENTION

This invention relates generally to computer memory, and more particularly to providing a system and method for dynamic random access memory (DRAM) device-level repair via address remappings external to the device.

FIG. 1 depicts a contemporary system composed of an integrated processor chip 100, which contains one or more processor elements and an integrated memory controller 110. In the configuration depicted in FIG. 1, multiple independent cascade interconnected memory interface busses 106 are logically aggregated together to operate in unison to support a single independent access request at a higher bandwidth with data and error detection/correction information distributed or "striped" across the parallel busses and associated devices. The memory controller 110 attaches to four narrow/high speed point-to-point memory busses 106, with each bus 106 connecting one of the several unique memory controller interface channels to a cascade interconnect memory subsystem 103 (or memory module, e.g., a DIMM) which includes at least a hub device 104 and one or more memory devices 109. Some systems further enable operations when a subset of the memory busses 106 are populated with memory subsystems 103. In this case, the one or more populated memory busses 108 may operate in unison to support a single access request.

FIG. 2 depicts a memory structure with cascaded memory modules 103 and unidirectional busses 106. One of the functions provided by the hub devices 104 in the memory modules 103 in the cascade structure is a re-drive function to send signals on the unidirectional busses 106 to other memory modules 103 or to the memory controller 110. FIG. 2 includes the memory controller 110 and four memory modules 103, on each of two memory busses 106 (a downstream memory bus with 24 wires and an upstream memory bus with 25 wires), connected to the memory controller 110 in either a direct or cascaded manner. The memory module 103 next to the memory controller 110 is connected to the memory controller 110 in a direct manner. The other memory modules 103 are connected to the memory controller 110 in a cascaded manner. Although not shown in this figure, the memory controller 110 may be integrated in the processor 100 and may connect to more than one memory bus 106 as depicted in FIG. 1.

During normal system operation, DRAM devices may exhibit persistent failures from individual memory cells and/or groups of cells, including entire rows and columns. Some memory subsystems address this problem by moving the data affected by these failures to an alternate storage location once the failure locations have been identified; this alternate location is commonly provided through an additional DRAM device, with the associated cost and power consumption increase. Nevertheless, DRAM devices generally are fabricated with an over allocation of rows and columns. FIG. 3 depicts a block diagram of a DRAM device 300 with non-redundant memory blocks 306 (made up of rows and columns and individual cells), redundant memory blocks 302 (made up of rows and columns and individual cells). These redundant memory blocks can be utilized to replace a limited number of cells which are initially found to be defective during the normal manufacturing process. This replacement is typically performed using permanent fusing. Often, the number of initially defective cells is far fewer than the number of redundant cells. The end result is that frequently unused good redundant memory blocks exist inside of the DRAM devices but are inaccessible in current practice.

BRIEF SUMMARY OF THE INVENTION

An exemplary embodiment of the present invention includes a memory controller in a system. The memory controller includes an interface to one or more memory devices via a memory module. The memory devices include addressable redundant and non-redundant memory blocks. The memory controller also includes a mechanism for utilizing one or more redundant memory blocks in place of one or more failing non-redundant memory blocks via an address remapping external to the memory device. The remapping occurs while the system is on-line.

Another exemplary embodiment includes a hub device in a memory system. The hub device includes an interface to one or more memory devices. The memory devices include addressable redundant and non-redundant memory blocks. The hub device also includes a mechanism for utilizing one or more redundant memory blocks in place of one or more failing non-redundant memory blocks via a remapping external to the memory device. The remapping occurs while the system is on-line.

Another exemplary embodiment includes a method for providing DRAM device level repair in a memory system. The method includes computer instructions for facilitating receiving a request to remap data in a non-redundant memory block of a memory device into a redundant location on the memory device. The redundant location has a redundant location address. Data from the non-redundant memory block is copied into the redundant location and the non-redundant memory block address is correlated to the redundant location address. The memory system is monitored to determine if reliability has improved while continuing to update the data in both the non-redundant memory block and the redundant location in response to requests to access the data at the redundant memory block. If it is determined that the reliability has not improved, then the data from the redundant location is copied back into the non-redundant memory block, and the correlation between the non-redundant memory block address and the redundant location address is removed.

A further exemplary embodiment includes a method for providing DRAM device level repair in a memory system. The method includes computer instructions for facilitating receiving a request to access data at an address in a non-redundant memory block of a memory device. The memory device includes non-redundant and redundant memory blocks. It is determined if the address requires remapping. If the address requires remapping, then the address is remapped into a redundant location address, and the data is accessed at the redundant location address in response to the request. Thus, memory device level repair is provided via an address remapping external to the memory device.

BRIEF DESCRIPTION OF THE DRAWINGS

Referring now to the drawings wherein like elements are numbered alike in the several FIGURES.

DETAILED DESCRIPTION OF EXEMPLARY EMBODIMENTS

Figure 1:
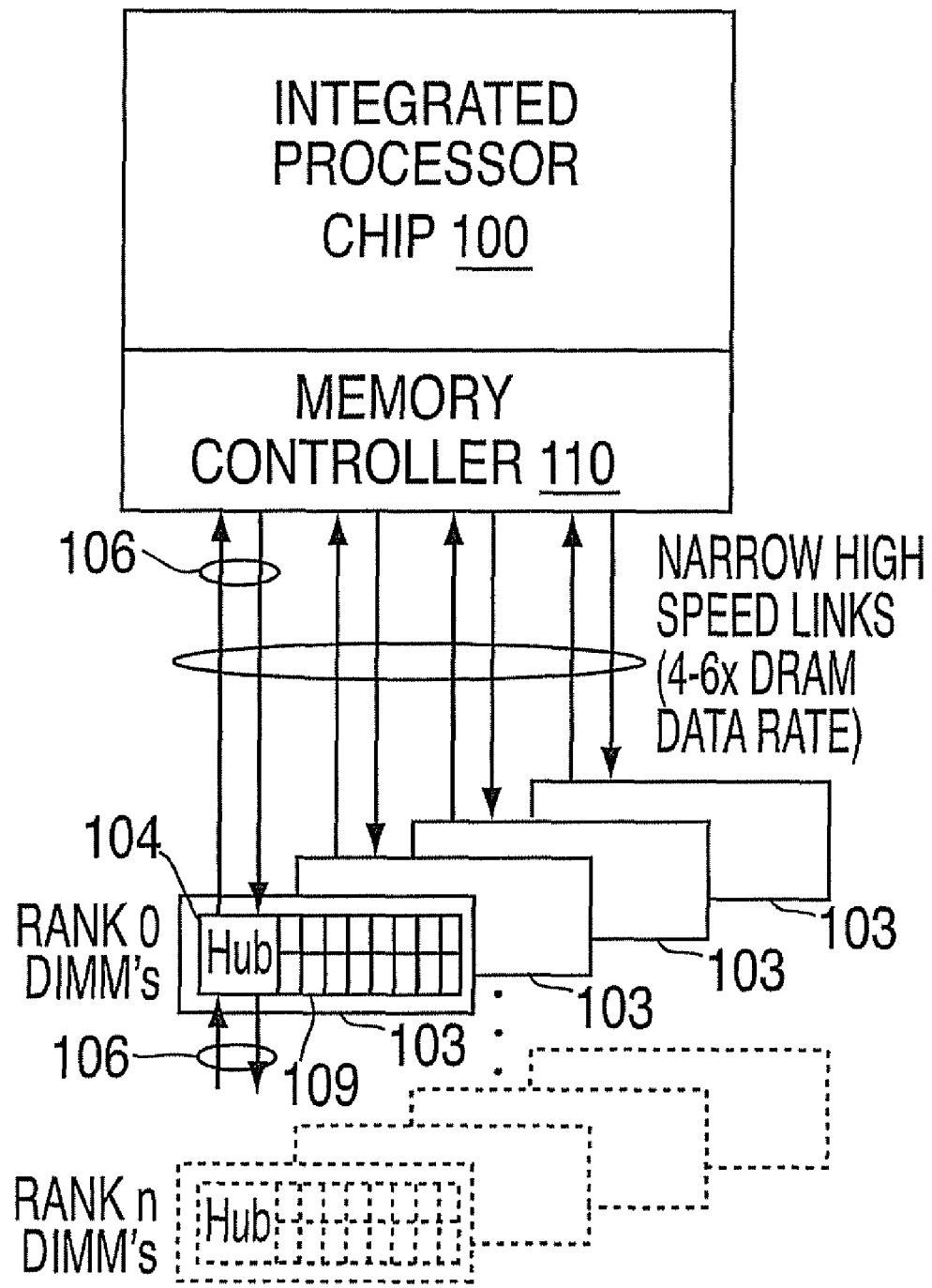
FIG. 1 depicts a cascade interconnect memory system with unidirectional busses.
Figure 2:
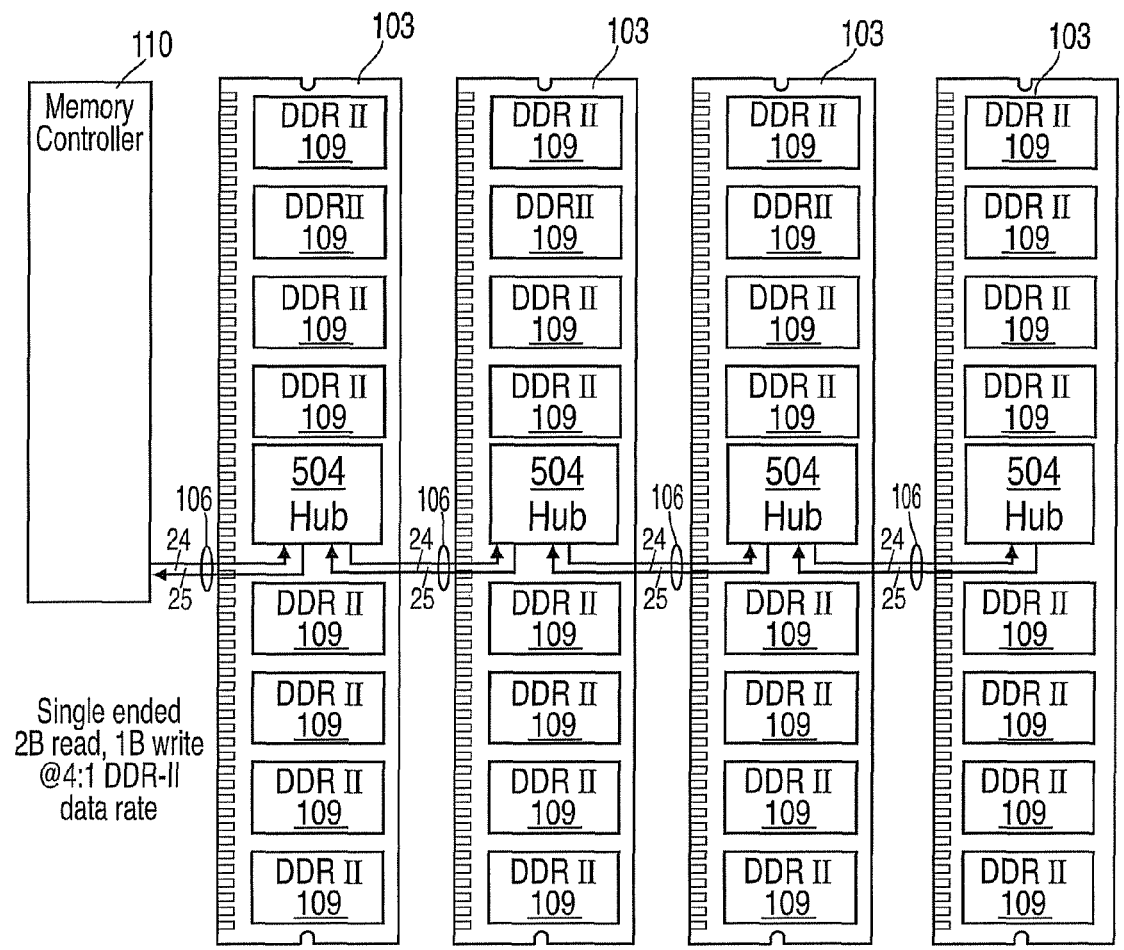
FIG. 2 depicts a cascade interconnect memory system with unidirectional busses.
Figure 3:
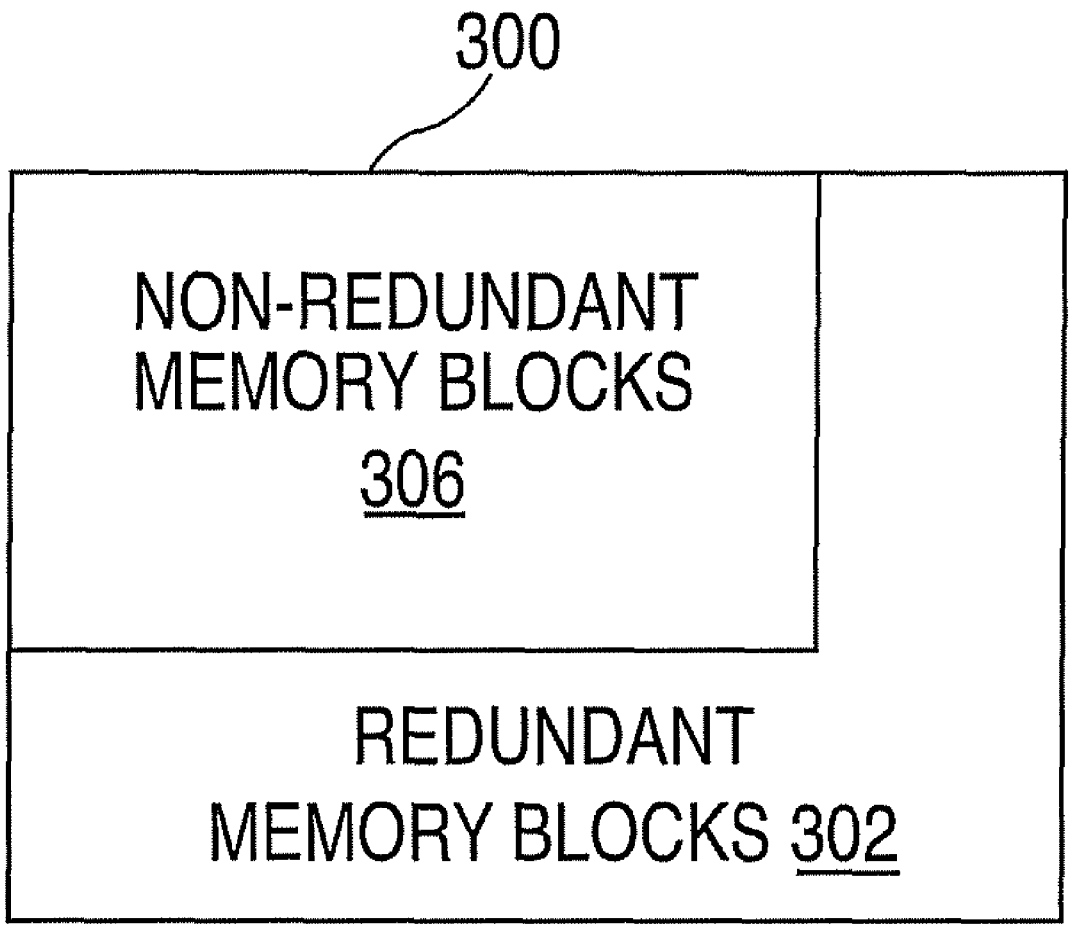
FIG. 3 is a block diagram of a DRAM device with redundant cells that may be utilized by exemplary embodiments.

An exemplary embodiment of the present invention addresses the problem of repairing DRAM devices, while the memory system is running, through the use of the redundant memory blocks available inside DRAM devices. Memory blocks are made up of individual memory cells, and may include a block of memory rows, a block of memory columns, and a subset of one or more rows and one or more columns. Advantages of an exemplary embodiment are that it requires minimal support at the DRAM device, it is applicable both when the redundant cells are guaranteed to be good at fabrication time and when some of the redundant cells may be bad, and it can be implemented at the system level without interruption of memory system operation (i.e., while the system is on-line).

The DRAM redundant memory blocks are accessible through one of various mechanisms. In one such mechanism, a set of commands is available to instruct the DRAM to set/unset a special DRAM internal mode; in another implementation an additional address pin is employed to select the redundant memory blocks 302. When the mode is activated, all subsequent addresses will be interpreted to refer to the redundant memory blocks 302. It is not assumed that all of the redundant cells are guaranteed to be good, and an exemplary embodiment relies on system-level error correction codes (ECCs) to revert back to the pre-repair state if the repair does not result in a more reliable storage medium. A hub chip (or memory controller) then maintains an internal table that logs failing blocks of address for which a substitution has been made. Upon finding a request for one of those addresses, the hub chip (or memory controller) requests the alternate data located in the redundant cells. Access to the redundant cells may be via one or more of the methods described herein (e.g., additional address pins, DRAM change mode commands, etc.). It is expected that only a small number of memory blocks will need to be tracked to be able to repair a majority of memory failure events.

A DRAM device diagnostic consists of individual testing of all of its memory elements in order to determine which memory blocks (made up of one or more memory cells) are failing, so that the failing blocks can be spared out with redundant elements. For this to work, the redundant elements must also be tested so that it is known which ones can be used (the redundant elements are sensitive to all the same failure mechanisms as normal elements). A common practice of DRAM manufacturers today is to use an "extended address" built into the DRAM design that enables a steering path to access the redundant array elements during a diagnostic testing procedure. The purpose of the redundant memory blocks 306 is to serve as a repository of alternate DRAM cells in case the regular (non-redundant)_cells are defective. During testing by the DRAM manufacturer, if some non-redundant DRAM cells are defective then alternate cells (generally grouped in rows or columns) are selected from the redundant memory blocks 306 as replacements. Through a permanent fusing mechanism the individual DRAM device is set to store and retrieve data from non-redundant and redundant memory blocks transparently as required by the addresses being written or read from. It is important to note that although these redundant cells are currently accessible to the DRAM manufacturer, they are not accessible according to current DRAM standard specifications. Thus, the redundant cells are currently available when the system is off-line. In exemplary embodiments of the present invention, the DRAM device is fabricated with some differences to current practice in order to enable the resulting improvements in system operation.

In an exemplary embodiment of the present invention, access is gained to the DRAM redundant memory blocks 306 through the use of the "extended address" referred to above. Access to the redundant memory blocks 306 is gained while the system is operating in a production environment (i.e., not in a test environment) to support memory access requests. Thus, in exemplary embodiments described herein, access is gained to the redundant memory blocks 306 while the system is in an on-line mode. In order to select the redundant region, it is necessary to drive the extended address signal with a given desired value. One way to achieve this is to augment the DRAM access protocol so that an internal DRAM register mode is updated at the request of the DRAM device's user (e.g., a memory controller or hub chip). A single bit of this register mode is then connected to the extended address control line. Another technique includes adding an additional pin to the DRAM to specify whether or not an access is to the redundant area. Note that this additional extended address control line is typically available (or easily could be available) as a die pad, but currently is not accessible at the package level. These and other techniques are described further below.

In an exemplary embodiment it is assumed that the basic memory element of access is equal to the device width (DQ bits) times the prefetch burst length, and that an element is deemed bad (or faulty) if any of the underlying bits are bad. In some systems, the basic element of access does not make full use of the available burst length; exemplary embodiments described herein also apply to these systems.

Current memory organizations group several DRAM devices in parallel to form a memory rank (see, for e.g., FIG. 1). Common implementation practice is such that memory ranks share (logically) the same address and command bus that originates from the memory hub chip or the memory controller. In one exemplary embodiment of the present invention, the repair decision is applied selectively only to the failing memory device through the use of a chip-select signal available at the DRAM device or through alternate techniques that do not require the expense of additional signals at the hub chip or memory controller (alternate techniques are also discussed herein). Even when the repair decision is chip-selective, it is noted that every chip in a rank receives exactly the same address and command information and therefore, in a simple embodiment, the association between the address received and the redundant rows/columns to which the address is mapped is obtained by dropping a subset of the bits of the address data.

In order to enhance the practicality of the present invention, the memory controller (or hub device) maintains a list of blocks of addresses that have been repaired, along with the repair solution applied. Note that a DRAM address consists of a row address and a column address. In the simplest case, there are two possible repair solutions: a block of rows is re-mapped to alternate rows, or a block of columns is re-mapped to alternate columns. These two may be applied simultaneously to a given address but the decisions to remap are independent for simplicity reasons. Thus, a total of three DRAM change mode commands are sufficient at the DRAM in order to implement this protocol: 1) an enable redundant area for rows command; 2) an enable redundant area for columns command; and 3) a disable redundant area for both rows and columns command.

For every address that is to be applied to the DRAM address bus, it is determined whether its row and/or column is located in the list of address blocks maintained in the memory controller (or hub device). If any of them do, then the appropriate repair action is applied (e.g., implemented using the DRAM change mode commands). In other cases, the repair solution may be more complex than just a direct map; for example there may be two possible target locations in the redundant area for a row/column instead of just one and these locations are then encoded with an additional bit in the list. To implement this mapping, a DRAM command which selects which of the two target locations to utilize is required, in this case there must be two redundant addresses associated with a given DRAM address. The most general case allows arbitrary mappings of any row/column to any spare row/column.

After a decision to remap a block of addresses is done, the data in the DIMM is scanned so as to copy the data in the old location into its new location (this action is referred to herein as an address repair, in contrast with the block repair described below which requires additional steps before completion). After the scanning has completed, a second scan is performed to test the reliability of the repaired addresses. If the data's reliability has improved (e.g., it now has no errors, or at least fewer errors), then the block repair has been completed and all subsequent accesses to that block will be to the alternate area through the proper remapping at the memory controller (or hub device). If the computer system requests data from a block that is not yet repaired, then the data is provided from the original location. If the computer system requests a write to an address that has been repaired, but the corresponding block repair process has not been completed, then data is written to both the old location and the new repaired location.

Figure 4:
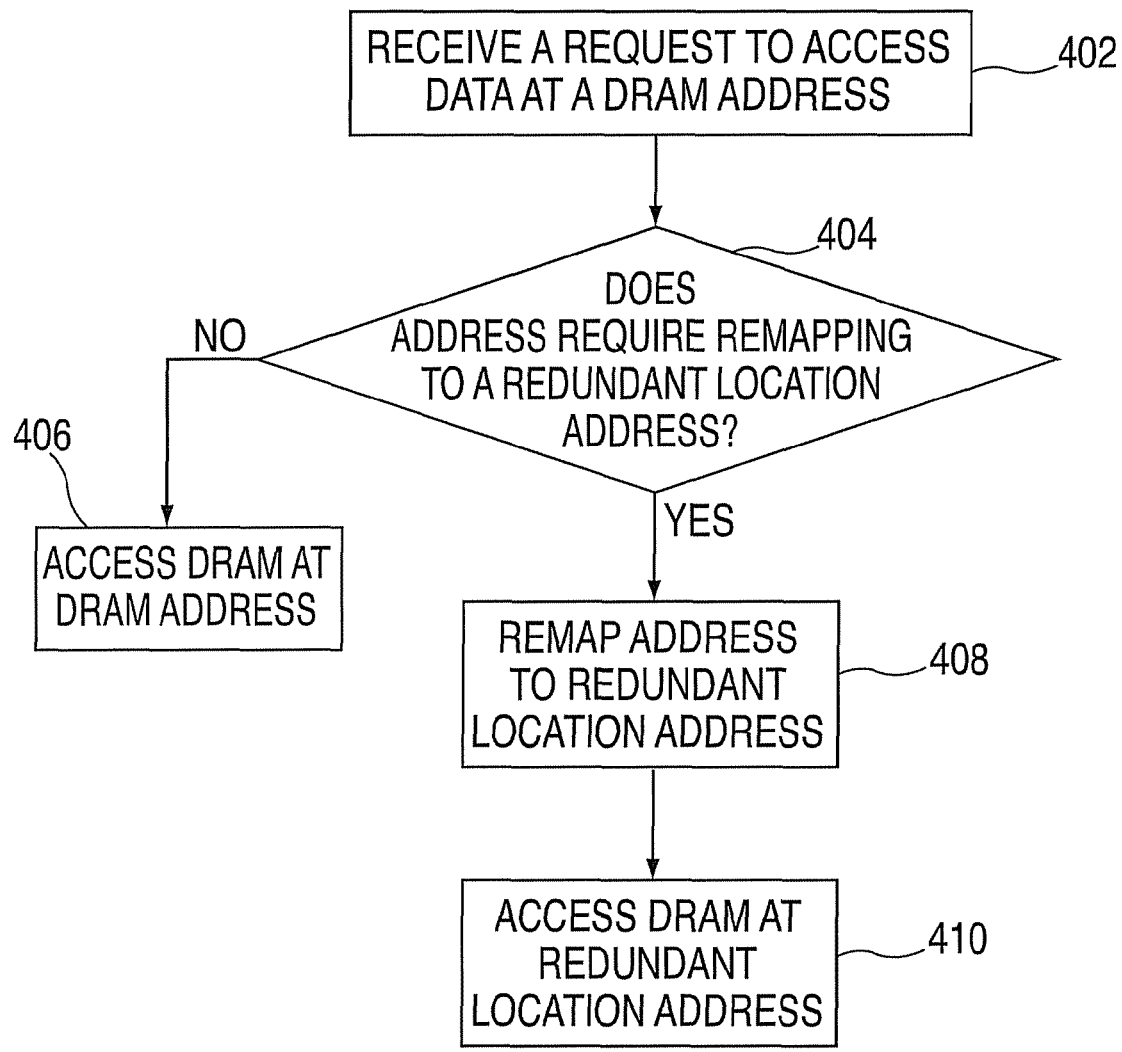
FIG. 4 is a flow diagram of a process for addressing data utilizing redundant cells that may be implemented by exemplary embodiments.

FIG. 4 is a flow diagram of a process for addressing data utilizing redundant cells that may be implemented by exemplary embodiments. At block 402, a request is received to access data at a non-redundant DRAM address. At block 404, it is determined whether the address requires remapping to a redundant location address (located in one or more redundant rows and a columns). In an exemplary embodiment, the determination is made using a table of remapped address blocks that is stored in a memory controller or memory hub device. In an exemplary embodiment, the table includes an entry for each non-redundant address block that has been remapped to a redundant location address block. The entry includes the original non-redundant address block and the corresponding redundant address block. The table of remapped address blocks may include just address blocks that have been remapped to a redundant location address block or it could also include address blocks that have been remapped to non-redundant location address blocks. In an exemplary embodiment, when the table is located on a hub device, it tracks remappings for each memory device attached to the hub device. In an alternate exemplary embodiment, when the table is located on a memory controller, it tracks remappings for each memory device attached to the memory controller. In an alternate embodiment entire memory ranks are affected by the repair, as opposed to individual DRAM devices, and therefore the hub or memory controller track repaired addresses in a per memory rank basis instead. The size of the address blocks in the table may vary as an address block could include a single cell, an entire row, an entire column and/or sets of rows and columns.

If it is determined at 404, that the address does not require remapping, then block 406 is performed and the DRAM is accessed at the received DRAM address.

If it is determined at 404, that the address does require remapping, then block 408 is performed and the non-redundant DRAM location is remapped to the redundant location address that corresponds to the received address in the table of remapped address blocks. Next block 410 is performed and the DRAM device is accessed at the redundant location address (instead of at the received non-redundant DRAM address). There are several methods that may be implemented to access the redundant location addresses in the DRAM device. One method is to utilize an additional address pin to set the extended address control line to allow access to the redundant area. Another method is for the DRAM device to support the DRAM change mode commands described previously. In alternate exemplary embodiments, redundant rows/columns of a DRAM device may be accessed without the use of additional address pins, the use of special DRAM commands, or the chip select signal in the DRAM (which is associated with an increased cost in the number of signals from the memory controller/hub). In one exemplary embodiment, the protocol for accessing the DRAM is such that a free bit is naturally available when the row/address information is being transferred. In this case, the free bit is utilized to set the extended address control line (which will allow access to data located in the redundant location addresses.

In another exemplary embodiment, special commands are implemented by prohibiting the memory controller (or hub device) from using certain address sequences. The commands are then implemented by using the disallowed address sequences. The prohibition at the side of the memory controller (or hub device) is not significant because it can always reorder or insert an intervening address in the middle of two addresses and because the occurrence of this event is statistically insignificant. A simple example follows. The disallowed sequence is [a, a XOR 23984894], where the integer with which a is being XORed is chosen at random by the designer but is fixed otherwise during system operation. Whenever this sequence shows up at a DRAM, the DRAM enters a special mode (e.g., a configuration mode). The DRAM expects data to be written next in the data bus. This data contains specific command information for how to interpret subsequent data read/write requests. For example, if a DRAM gets written a "1" after observing the [a, a XOR 23984894] sequence, then it sets/unsets access to the redundant area. If it gets written a "0" then it does not do anything. The memory controller or hub device then avoids sending a [a, a XOR 23984894] sequence. If necessary, reordering or inserting some other command in the middle may be performed to avoid the sequence. Alternate exemplary embodiments may be implemented to extend this concept in many other directions to allow for fairly sophisticated management of the redundant area.

Figure 5:
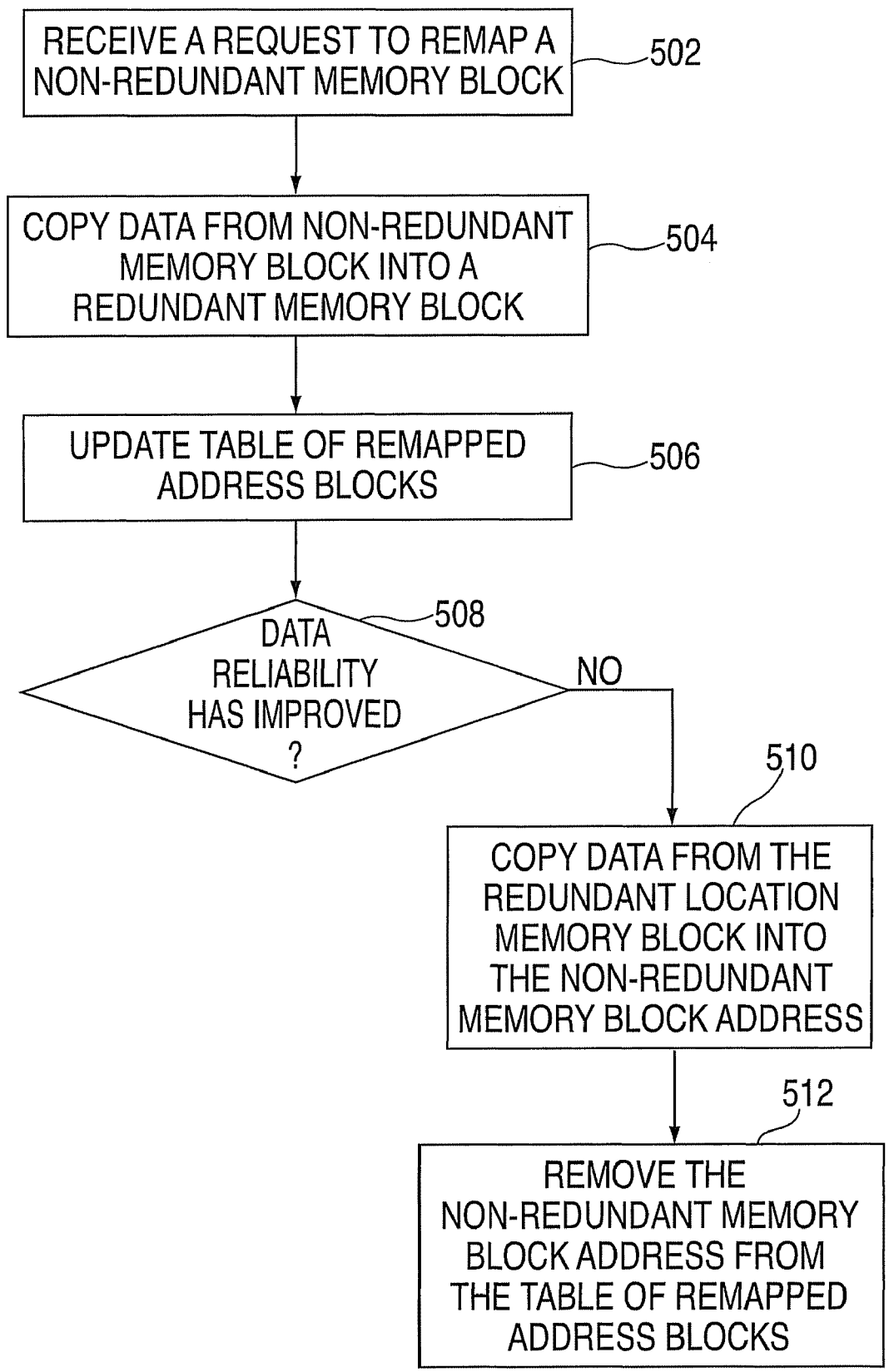
FIG. 5 is a flow diagram of a process for updating a table of remapped address blocks that may be implemented by exemplary embodiments.

FIG. 5 is a flow diagram of a process for updating a table of remapped address blocks that may be implemented by exemplary embodiments. At block 502 a request to remap a non-redundant memory block is received. At block 504, the data from the non-redundant memory block is copied into an unused address block in the redundant area of the DRAM device. Next, at block 506, the table of remapped address blocks is updated to correlate the address of the non-redundant memory block to the redundant location address block. At block 508, accesses to the data stored at the redundant location address block are monitored (or scanned) to determine if data reliability has improved since the remapping (i.e., has the repair been effective). If the reliability hasn't improved, then blocks 510 and 512 are performed to revert back (or back out) to the original mode of operation before the remapping was performed. Block 510 is performed to copy data from the redundant location address block into the original non-redundant memory block address in the DRAM device. Next, block 512 is performed to remove the non-redundant memory block address from the table of remapped address blocks. The matter of whether reliability has improved or not can be decided by counting how many errors occur in a given period of time before the repair and after the repair.

In many cases, the memory device may not support the change mode commands. As previously described, a property of an exemplary embodiment of the present invention is that is may be implemented even when the DRAM redundant bits are not guaranteed to be good. First, it is noted that it is feasible to periodically test (or test right before a repair is planned) the reliability of the redundant bits in a computer diagnostic mode, and to apply the remap decisions only when the new storage bits are known to be good.

Even if the testing procedure described above does not find any error, but an error actually results after storing the target data, exemplary embodiments of the present invention remain applicable. It is common practice for systems to add additional redundant memory devices in order to provide for error correction features; a common requirement is single chip error correction and double chip error detection. In one example, a memory device on a DIMM is failing while all of the other memory devices on the DIMM do not have any failures. A decision is made to repair the memory device by remapping a block of failing non-redundant memory block addresses to their alternate redundant memory block addresses. It is feasible for cells in the redundant memory blocks 306 to be defective, but since the repairs are being performed at the individual chip level, the stored data remains correctable. Thus, when the repair is scanned to check on its success, a decision is made to revert back to the original mode of operation if the repair is determined to be ineffective. One such judgment is based on the criterion that no error should exist after the repair.

It is feasible for the DIMM to possess correctable errors that are not in the same memory device within the DIMM. In this case, it is possible that after a repair is performed, that some previously correctable errors become uncorrectable. This could happen, for example, when chip B has errors at a given address and chip A, which did not have any errors at this address previous to the repair, now has errors. Nevertheless, even in this instance, the scheme proposed herein does not fail. This is because the block is never called "repaired" until the repair diagnostic test has been passed. In the meanwhile, data is always read from the old storage location and on writes, coherency between the old and the new redundant location is maintained through the process described above.

In cases where additional redundant bits are guaranteed to be good, it is feasible to apply the repair decision to all memory devices in a given rank simultaneously, eliminating the need for a chip select signal. Exemplary embodiments which combine these two extremes may also be implemented.

Figure 6:
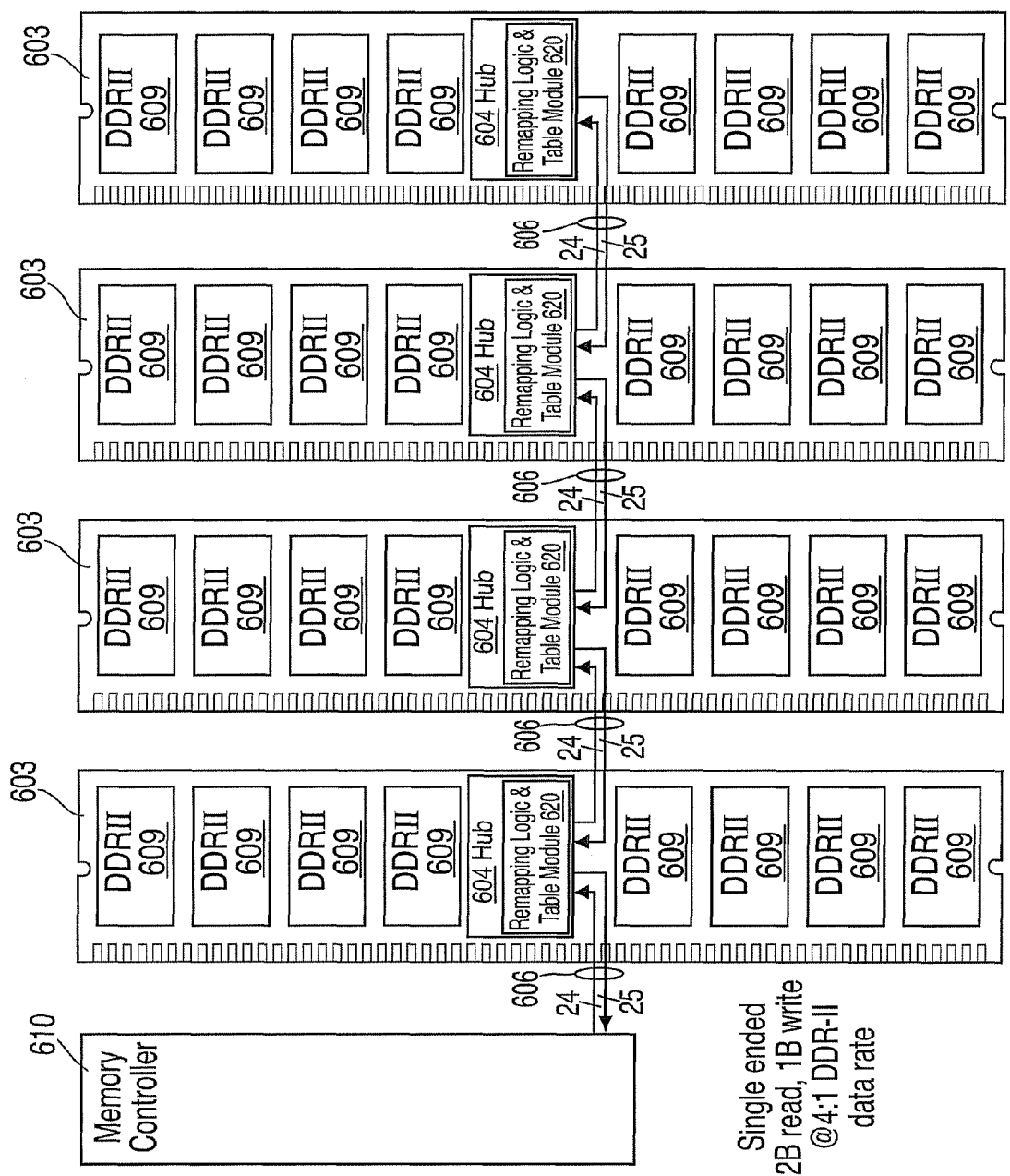
FIG. 6 is a block diagram of a system that may be implemented by exemplary embodiments.

FIG. 6 is a block diagram of a system that may be implemented by exemplary embodiments. FIG. 6 depicts a memory structure with cascaded memory modules 603 and unidirectional busses 606. One of the functions provided by the hub devices 604 in the memory modules 603 in the cascade structure is a re-drive function to send signals on the unidirectional busses 606 to other memory modules 603 or to the memory controller 610. FIG. 6 includes the memory controller 610 and four memory modules 603, on each of two memory busses 606 (a downstream memory bus with 24 wires and an upstream memory bus with 25 wires), connected to the memory controller 610 in either a direct or cascaded manner. The memory module 603 next to the memory controller 610 is connected to the memory controller 610 in a direct manner. The other memory modules 603 are connected to the memory controller 610 in a cascaded manner. Although not shown in this figure, the memory controller 610 may be integrated in the processor 600 and may connect to more than one memory bus 606 as depicted in FIG. 1. Each hub device 604 (or a subset of the hub devices 604) includes a remapping mechanism 620 to perform the processing described herein in reference to FIGS. 4 and 5. The remapping mechanism may be implemented by hardware and/or software instructions.

Figure 7:
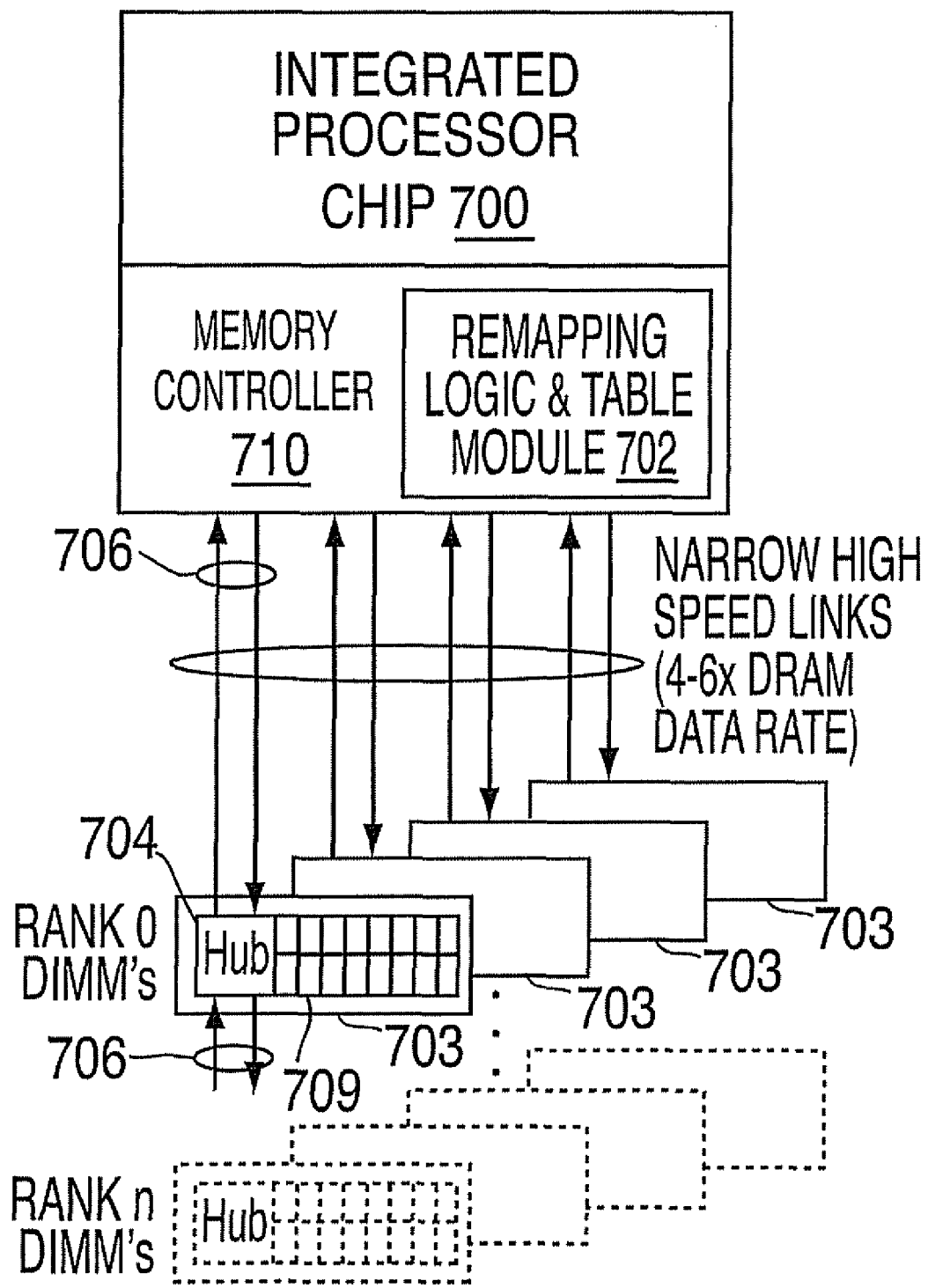
FIG. 7 is a block diagram of a system that may be implemented by exemplary embodiments.

FIG. 7 depicts an exemplary embodiment of a system composed of an integrated processor chip 700, which contains one or more processor elements and an integrated memory controller 710. The memory controller 710 attaches to five narrow/high speed point-to-point memory busses 706, with each bus 706 connecting one of the several unique memory controller interface channels to a cascade interconnect memory subsystem 703 (or memory module, e.g., a DIMM) which includes at least a hub device 704 and one or more memory devices 709. The memory controller 700 includes a remapping mechanism 702 to perform the processing described herein in reference to FIGS. 5 and 6. The remapping mechanism may be implemented by hardware and/or software instructions. In an alternate exemplary embodiment, the remapping mechanism 702 is located in the processor chip 700. In another exemplary embodiment, the remapping mechanism 702 is located on one or more of a hub device 704, the memory controller 710 and the processor 700 with processing being shared between them.

In an exemplary embodiment, hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device translates the memory access requests to control the memory devices to store write data from the hub device or to provide read data to the hub device. Read data is encoded into one or more communication packet(s) and transmitted through the memory bus(ses) to the memory controller.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links to connect to one or more hub chips and/or memory devices.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM which is a small circuit board or substrate composed primarily of RAM integrated circuits or die on one or both sides and single row of pins along one long edge. DIMMs have been constructed with pincounts ranging from 100 pins to over 300 pins. In exemplary embodiments described herein, memory modules may include two or more hub devices.

In exemplary embodiments, the memory bus is constructed using multi-drop connections to hub devices on the memory modules and/or using point-to-point connections. The downstream portion of the controller interface (or memory bus), referred to as the downstream bus, may include command, address, data and other operational, initialization or status information being sent to the hub devices on the memory modules. Each hub device may simply forward the information to the subsequent hub device(s) via bypass circuitry; receive, interpret and re-drive the information if it is determined to be targeting a downstream hub device; re-drive some or all of the information without first interpreting the information to determine the intended recipient; or perform a subset or combination of these options.

The upstream portion of the memory bus, referred to as the upstream bus, returns requested read data and/or error, status or other operational information, and this information may be forwarded to the subsequent hub devices via bypass circuitry; be received, interpreted and re-driven if it is determined to be targeting an upstream hub device and/or memory controller in the processor complex; be re-driven in part or in total without first interpreting the information to determine the intended recipient; or perform a subset or combination of these options.

In alternate exemplary embodiments, the point-to-point bus includes a switch or bypass mechanism which results in the bus information being directed to one of two or more possible hub devices during downstream communication (communication passing from the memory controller to a hub device on a memory module), as well as directing upstream information (communication from a hub device on a memory module to the memory controller), often by way of one or more upstream hub devices. Further embodiments include the use of continuity modules, such as those recognized in the art, which, for example, can be placed between the memory controller and a first populated hub device (i.e., a hub device that is in communication with one or more memory devices), in a cascade interconnect memory system, such that any intermediate hub device positions between the memory controller and the first populated hub device include a means by which information passing between the memory controller and the first populated hub device can be received even if the one or more intermediate hub device position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include main memory storage devices.

In exemplary embodiments, the memory system includes one or more hub devices on one or more memory modules connected to the memory controller via a cascade interconnect memory bus, however other memory structures may be implemented such as a point-to-point bus, a multi-drop memory bus or a shared bus. Depending on the signaling methods used, the target operating frequencies, space, power, cost, and other constraints, various alternate bus structures may be considered. A point-to-point bus may provide the optimal performance in systems produced with electrical interconnections, due to the reduced signal degradation that may occur as compared to bus structures having branched signal lines, switch devices, or stubs. However, when used in systems requiring communication with multiple devices or subsystems, this method will often result in significant added component cost and increased system power, and may reduce the potential memory density due to the need for intermediate buffering and/or re-drive.

Although not shown in the Figures, the memory modules or hub devices may also include a separate bus, such as a 'presence detect' bus, an I2C bus and/or an SMBus which is used for one or more purposes including the determination of the hub device an/or memory module attributes (generally after power-up), the reporting of fault or status information to the system, the configuration of the hub device(s) and/or memory subsystem(s) after power-up or during normal operation or other purposes. Depending on the bus characteristics, this bus might also provide a means by which the valid completion of operations could be reported by the hub devices and/or memory module(s) to the memory controller (s), or the identification of failures occurring during the execution of the main memory controller requests.

Performances similar to those obtained from point-to-point bus structures can be obtained by adding switch devices. These and other solutions offer increased memory packaging density at lower power, while retaining many of the characteristics of a point-to-point bus. Multi-drop busses provide an alternate solution, albeit often limited to a lower operating frequency, but at a cost/performance point that may be advantageous for many applications. Optical bus solutions permit significantly increased frequency and bandwidth potential, either in point-to-point or multi-drop applications, but may incur cost and space impacts.

As used herein the term "buffer" or "buffer device" refers to a temporary storage unit (as in a computer), especially one that accepts information at one rate and delivers it another. In exemplary embodiments, a buffer is an electronic device that provides compatibility between two signals (e.g., changing voltage levels or current capability). The term "hub" is sometimes used interchangeably with the term "buffer." A hub is a device containing multiple ports that is connected to several other devices. A port is a portion of an interface that serves a congruent I/O functionality (e.g., a port may be utilized for sending and receiving data, address, and control information over one of the point-to-point links, or busses). A hub may be a central device that connects several systems, subsystems, or networks together. A passive hub may simply forward messages, while an active hub, or repeater, amplifies and refreshes the stream of data which otherwise would deteriorate over a distance. The term hub device, as used herein, refers to a hub chip that includes logic (hardware and/or software) for performing memory functions.

Also as used herein, the term "bus" refers to one of the sets of conductors (e.g., wires, and printed circuit board traces or connections in an integrated circuit) connecting two or more functional units in a computer. The data bus, address bus and control signals, despite their names, constitute a single bus since each are often useless without the others. A bus may include a plurality of signal lines, each signal line having two or more connection points, that form a main transmission path that electrically connects two or more transceivers, transmitters and/or receivers. The term "bus" is contrasted with the term "channel" which is often used to describe the function of a "port" as related to a memory controller in a memory system, and which may include one or more busses or sets of busses. The term "channel" as used herein refers to a port on a memory controller. Note that this term is often used in conjunction with I/O or other peripheral equipment, however the term channel has been adopted by some to describe the interface between a processor or memory controller and one of one or more memory subsystem(s).

Further, as used herein, the term "daisy chain" refers to a bus wiring structure in which, for example, device A is wired to device B, device B is wired to device C, etc. The last device is typically wired to a resistor or terminator. All devices may receive identical signals or, in contrast to a simple bus, each device may modify one or more signals before passing them on. A "cascade" or cascade interconnect' as used herein refers to a succession of stages or units or a collection of interconnected networking devices, typically hubs, in which the hubs operate as a logical repeater, further permitting merging data to be concentrated into the existing data stream. Also as used herein, the term "point-to-point" bus and/or link refers to one or a plurality of signal lines that may each include one or more terminators. In a point-to-point bus and/or link, each signal line has two transceiver connection points, with each transceiver connection point coupled to transmitter circuitry, receiver circuitry or transceiver circuitry. A signal line refers to one or more electrical conductors or optical carriers, generally configured as a single carrier or as two or more carriers, in a twisted, parallel, or concentric arrangement, used to transport at least one logical signal.

Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs or any of the expected follow-on devices such as DDR2, DDR3, DDR4 and related technologies such as Graphics RAMs, Video RAMs, LP RAM (Low Power DRAMs) which are often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including solder interconnects, conductive adhesives, socket structures, pressure contacts and other methods which enable communication between the two or more devices via electrical, optical or alternate means.

The one or more memory modules (or memory subsystems) and/or hub devices may be electrically connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc. Electrical interconnections on a memory module are often referred to as contacts, or pins, or tabs. Electrical interconnections on a connector are often referred to as contacts or pins.

As used herein, the term memory subsystem refers to, but is not limited to: one or more memory devices; one or more memory devices and associated interface and/or timing/control circuitry; and/or one or more memory devices in conjunction with a memory buffer, hub device, and/or switch. The term memory subsystem may also refer to one or more memory devices, in addition to any associated interface and/or timing/control circuitry and/or a memory buffer, hub device or switch, assembled into a substrate, a card, a module or related assembly, which may also include a connector or similar means of electrically attaching the memory subsystem with other circuitry. The memory modules described herein may also be referred to as memory subsystems because they include one or more memory devices and hub devices Additional functions that may reside local to the memory subsystem and/or hub device include write and/or read buffers, one or more levels of memory cache, local pre-fetch logic, data encryption/decryption, compression/decompression, protocol translation, command prioritization logic, voltage and/or level translation, error detection and/or correction circuitry, data scrubbing, local power management circuitry and/or reporting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers (e.g. packets) along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

One or more clocking methods may be utilized within the memory subsystem and the memory system itself, including global clocking, source-synchronous clocking, encoded clocking or combinations of these and other methods. The clock signaling may be identical to that of the signal lines themselves, or may utilize one of the listed or alternate methods that is more conducive to the planned clock frequency (ies), and the number of clocks planned within the various subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the subsystem, or may be based on a clock that is derived from the clock related to the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information. This information may be communicated using communication methods that may be consistent with normal memory device interface specifications (generally parallel in nature), the information may be encoded into a 'packet' structure, which may be consistent with future memory interfaces or simply developed to increase communication bandwidth and/or enable the subsystem to operate independently of the memory technology by converting the received information into the format required by the receiving device(s).

Initialization of the memory subsystem may be completed via one or more methods, based on the available interface busses, the desired initialization speed, available space, cost/complexity objectives, subsystem interconnect structures, the use of alternate processors (such as a service processor) which may be used for this and other purposes, etc. In one embodiment, the high speed bus may be used to complete the initialization of the memory subsystem(s), generally by first completing a training process to establish reliable communication, then by interrogation of the attribute or 'presence detect' data associated the various components and/or characteristics associated with that subsystem, and ultimately by programming the appropriate devices with information associated with the intended operation within that system. In a cascaded system, communication with the first memory subsystem would generally be established, followed by subsequent (downstream) subsystems in the sequence consistent with their position along the cascade interconnect bus.

A second initialization method would include one in which the high speed bus is operated at one frequency during the initialization process, then at a second (and generally higher) frequency during the normal operation. In this embodiment, it may be possible to initiate communication with all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency (ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic included in each of these subsystems.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also offers the advantage of providing an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) will help facilitate increased function on integrated devices as well as the integration of functions previously implemented on separate devices. This integration will serve to improve overall performance of the intended function, as well as promote increased storage density, reduced power, reduced space requirements, lower cost and other manufacturer and customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Any or all of the various elements may include error detection and/or correction methods such as CRC (Cyclic Redundancy Code), EDC (Error Detection and Correction), parity or other encoding/decoding methods suited for this purpose. Further reliability enhancements may include operation re-try (to overcome intermittent faults such as those associated with the transfer of information), the use of one or more alternate or replacement communication paths to replace failing paths and/or lines, complement-re-complement techniques or alternate methods used in computer, communication and related systems.

The use of bus termination, on busses as simple as point-to-point links or as complex as multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage or another signal. The termination device(s) may be part of a passive or active termination structure, and may reside in one or more positions along one or more of the signal lines, and/or as part of the transmitter and/or receiving device(s). The terminator may be selected to match the impedance of the transmission line, or selected via an alternate approach to maximize the useable frequency, operating margins and related attributes within the cost, space, power and other constraints.

Technical effects and benefits include that it requires minimal support at the DRAM device, it is applicable both when the redundant cells are guaranteed to be good at fabrication time or when some of them may be bad, and it can be implemented at the system level without interruption of memory system operation. This may lead to significant improvements in memory system availability and serviceability.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A memory controller in a system, the memory controller comprising:
    one or more memory modules comprising one or more memory devices, each of the one or more memory devices including addressable redundant and non-redundant memory blocks; and
    a mechanism for utilizing one or more redundant memory blocks in a memory device in place of one or more failing non-redundant memory blocks in the memory device via an address remapping external to the memory device, the memory device one of the one or more memory devices, and the remapping occurring while the system is on-line.

2. The memory controller of claim 1 wherein the mechanism determines if the remapping improves reliability of the memory system and backs out the remapping if it is determined that the reliability has not improved.

3. The memory controller of claim 1 wherein the mechanism accesses data at the one or more redundant memory blocks in response to requests to access data at the one or more failing non-redundant memory blocks.

4. The memory controller of claim 3 wherein the mechanism augments a memory device access protocol to include the information that a redundant memory block will be utilized.

5. The memory controller of claim 3 wherein the mechanism utilizes an additional address pin to communicate to the memory devices that a redundant memory block will be accessed.

6. The memory controller of claim 3 wherein the mechanism utilizes a change mode command to communicate to the memory devices that a redundant memory block will be accessed.

7. The memory controller of claim 3 wherein the mechanism utilizes a command to initiate a configuration mode in the memory device, wherein the configuration mode allows access to the redundant memory blocks.

8. The memory controller of claim 1 wherein the redundant and non-redundant memory blocks include one or more of a block of rows, a block of columns, and a subset of one or more rows and one or more columns.

9. A hub device in a memory system, the hub device comprising:
one or more memory devices, each of the one or more memory devices including addressable redundant and non-redundant memory blocks; and
a mechanism for utilizing one or more redundant memory blocks in a memory device in place of one or more failing non-redundant memory blocks in the memory device via a remapping external to the memory device, the memory device one of the one or more memory devices, and the remapping occurring while the system is on-line.

10. The hub device of claim 9 wherein the mechanism determines if the remapping improves reliability of the memory system and backs out the remapping if it is determined that the reliability has not improved.

11. The hub device of claim 9 wherein the mechanism accesses data at the one or more redundant memory blocks in response to requests to access data at the one or more failing non-redundant memory blocks.

12. The hub device of claim 11 wherein the mechanism augments a memory device access protocol to include the information that a redundant memory block will be utilized.

13. The hub device of claim 11 wherein the mechanism utilizes an additional address pin to communicate to the memory devices that a redundant memory block will be accessed.

14. The hub device of claim 11 wherein the mechanism utilizes a change mode command to communicate to the memory devices that a redundant memory block will be accessed.

15. The hub device of claim 11 wherein the mechanism utilizes a command to initiate a configuration mode in the memory device, wherein the configuration mode allows access to the redundant memory blocks.

16. The hub device of claim 9 wherein the addressable non-redundant and redundant memory blocks include one or more of a block of rows, a block of columns, and a subset of one or more rows and one or more columns.

17. A computer implemented method for providing DRAM device level repair in a memory system, the method comprising:
receiving a request to remap data in a non-redundant memory block of a memory device into a redundant location on the same memory device, the redundant location having a redundant location address;
copying the data from the non-redundant memory block of the memory device into the redundant location of the same memory device and correlating the non-redundant memory block address to the redundant location address;
monitoring the memory system to determine if reliability has improved while continuing to update the data in both the non-redundant memory block of the memory device and the redundant location of the same memory device in response to requests to access the data at the redundant memory block; and
copying the data from the redundant location back into the non-redundant memory block and removing the correlation between the non-redundant memory block address and the redundant location address, in response to determining that the reliability has not improved.

18. The method of claim 17 wherein the method is executed by a memory controller in communication with the memory device or by a hub device in communication with the memory device.

19. A computer implemented method for providing DRAM device level repair in a memory system, the method comprising:
receiving a request to access data at an address in a non-redundant memory block of a memory device, the memory device including non-redundant and redundant memory blocks;
determining, responsive to receiving the request to access data if the address requires remapping; and
in response to determining that the address requires remapping:
remapping the address into a redundant location address on the same memory device;
copying the data from the non-redundant memory block to the redundant memory block; and
accessing the data at the redundant location address in the same memory device in response to the request, thereby providing memory device level repair while the system is on-line via an address remapping between two memory locations on the same memory device via a memory remapping external to the memory device.

20. The method of claim 19 wherein the method is executed by a memory controller in communication with the memory device or by a hub device in communication with the memory device.

21. The memory controller of claim 1 wherein the memory device is a dynamic random access memory (DRAM).

22. The hub device of claim 9 wherein the memory device is a dynamic random access memory (DRAM).

* * * * *